(12) United States Patent
Jin et al.

(10) Patent No.: US 12,501,798 B2
(45) Date of Patent: Dec. 16, 2025

(54) DISPLAY DEVICE

(71) Applicant: Samsung Display Co., LTD., Yongin-si (KR)

(72) Inventors: Guanghai Jin, Yongin-si (KR); Yongseog Kim, Yongin-si (KR); Hye Jin Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 383 days.

(21) Appl. No.: 18/327,796

(22) Filed: Jun. 1, 2023

(65) Prior Publication Data

US 2024/0065056 A1     Feb. 22, 2024

(30) Foreign Application Priority Data

Aug. 18, 2022 (KR) .......................... 10-2022-0103615

(51) Int. Cl.
*H10K 59/131* (2023.01)
*H10K 59/88* (2023.01)

(52) U.S. Cl.
CPC ........... *H10K 59/131* (2023.02); *H10K 59/88* (2023.02)

(58) Field of Classification Search
CPC ............................. H10K 59/131; H10K 59/88
See application file for complete search history.

(56) References Cited

U.S. PATENT DOCUMENTS

| | | | |
|---|---|---|---|
| 10,109,688 B2 | 10/2018 | Han | |
| 2015/0188538 A1* | 7/2015 | Huh | .................. H03K 17/9622 349/12 |

* cited by examiner

*Primary Examiner* — Douglas M Menz
(74) *Attorney, Agent, or Firm* — Womble Bond Dickinson (US) LLP

(57) ABSTRACT

A display device includes a substrate including a display area and a peripheral area, a light-emitting element in the display area, signal transmission lines on the substrate, extending in a first direction, and repeatedly located along a second direction crossing the first direction, separation spaces respectively between adjacent ones of the signal transmission lines, and adjacent to each other in an oblique direction, and an identification pattern including at least one identification block in the separation spaces.

20 Claims, 10 Drawing Sheets

FIG. 3
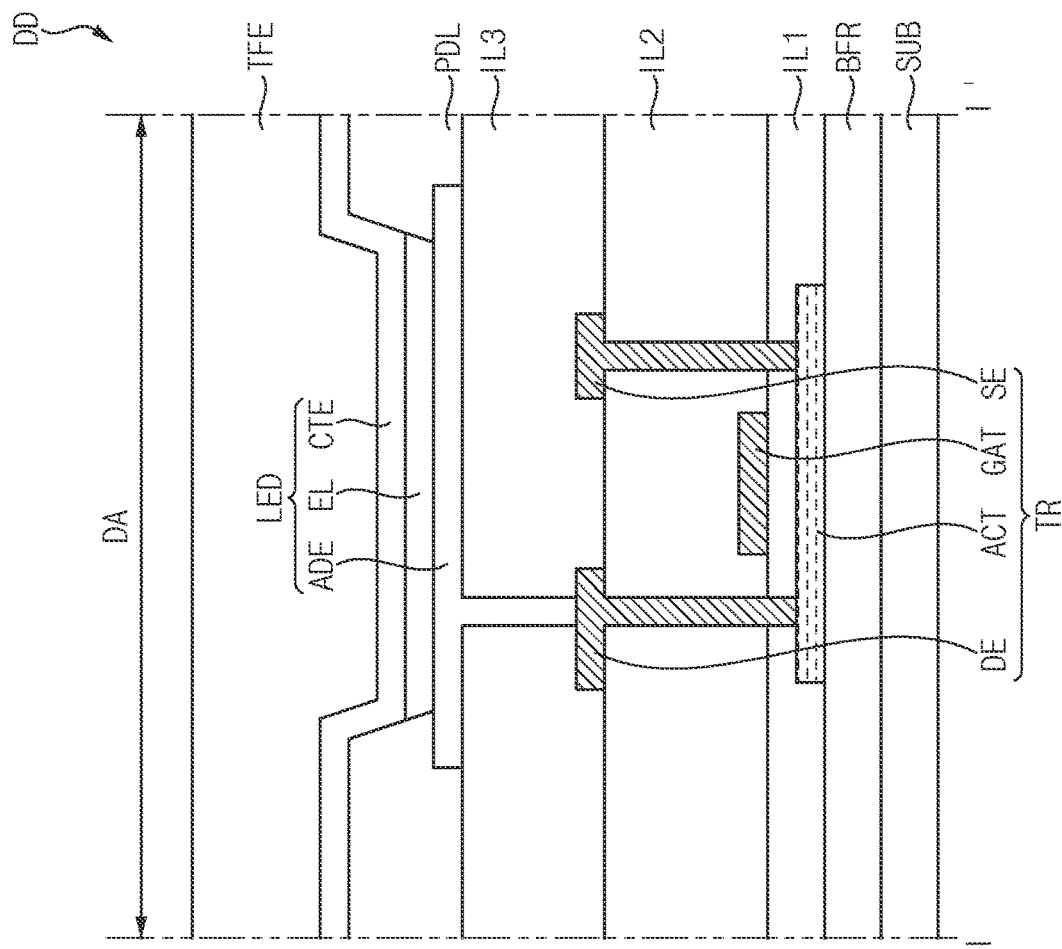
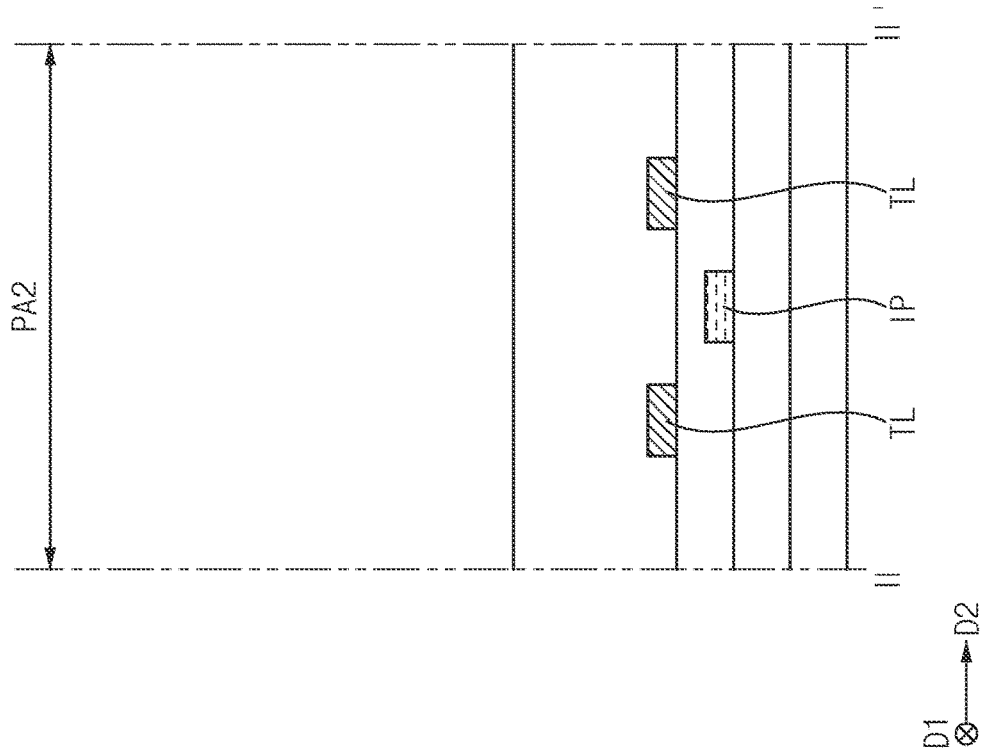

FIG. 4
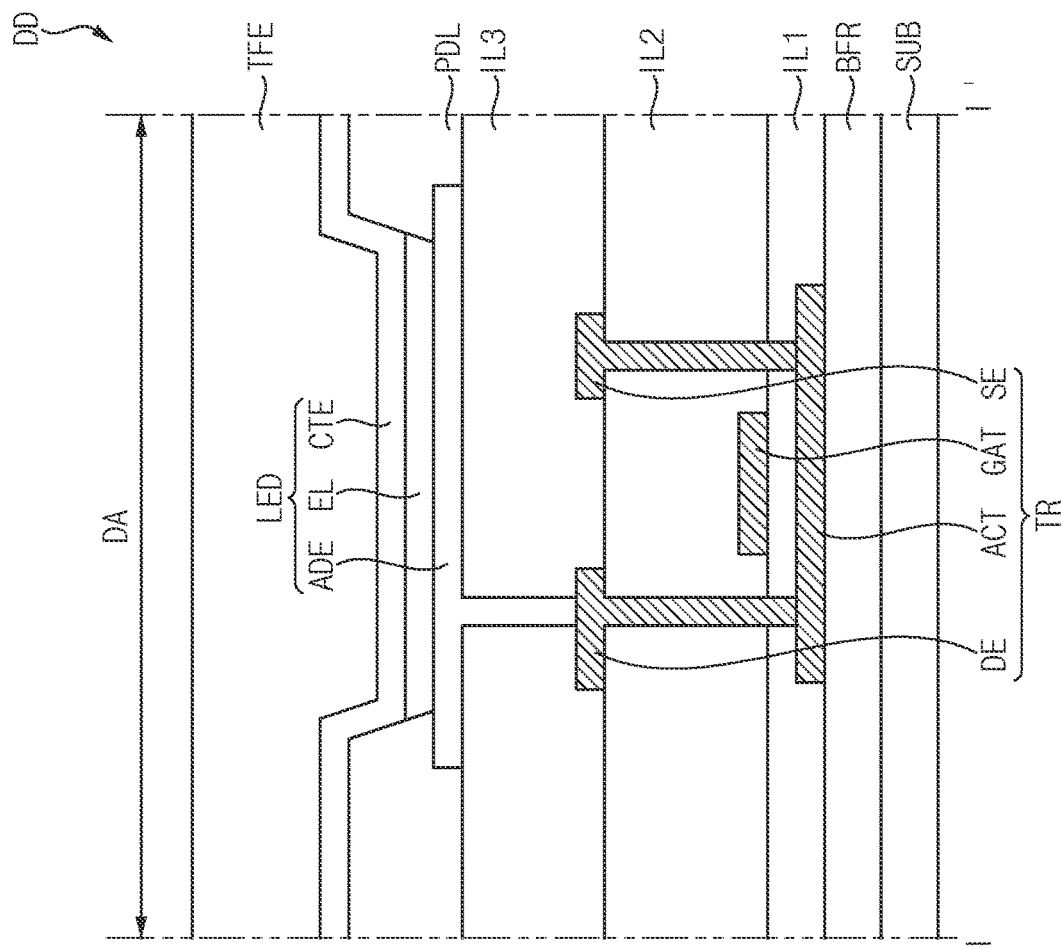
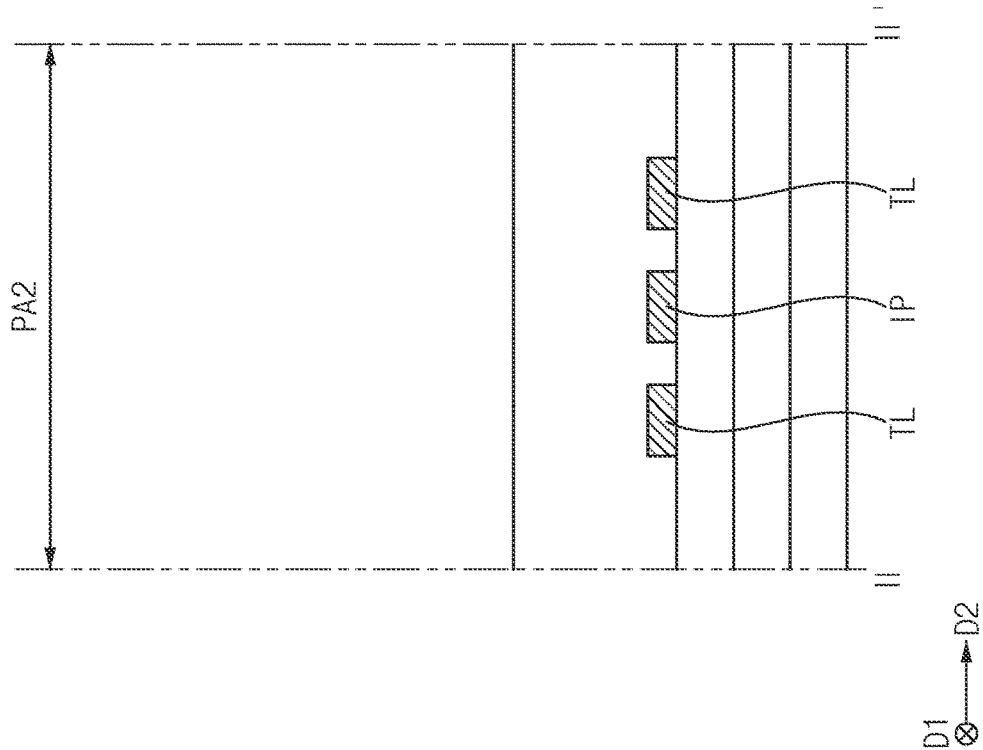

DISPLAY DEVICE

CROSS-REFERENCE TO RELATED APPLICATION

This application claims priority to, and the benefit of, Korean Patent Application No. 10-2022-0103615, filed on Aug. 18, 2022, which is hereby incorporated by reference for all purposes as if fully set forth herein.

BACKGROUND

1. Field

Embodiments generally relate to a display device that provides visual information.

2. Description of the Related Art

As information technology develops, the importance of display devices, which are communication media between users and information, is being highlighted. Accordingly, the use of display devices, such as a liquid crystal display device, an organic light-emitting display device, a plasma display device, and the like is increasing.

A plurality of signal transmission lines may be located at a lower portion of the display device. When a driving defect of the display device occurs, an identification number may be inserted between signal transmission lines to find a location where the defect occurs. The identification number may indicate the position of the signal transmission line.

SUMMARY

Embodiments provide a display device with reduced dead space.

A display device according to embodiments of the present disclosure may include a substrate including a display area and a peripheral area, a light-emitting element in the display area, signal transmission lines on the substrate, extending in a first direction, and repeatedly located along a second direction crossing the first direction, separation spaces respectively between adjacent ones of the signal transmission lines, and adjacent to each other in an oblique direction, and an identification pattern including at least one identification block in the separation spaces.

A width of the separation spaces may be greater than a width of a shortest distance between two adjacent signal transmission lines of the signal transmission lines.

The signal transmission lines may include a first line including a (1-1)th bent portion positioned in a first row, another first line including a (1-2)th bent portion positioned in a third row, a second line including a (2-1)th bent portion positioned in the first row and a (2-2)th bent portion positioned in a second row between the first row and the second row, and a third line including a (3-1)th bent portion positioned in the second row and a (3-2)th bent portion positioned in the third row.

The separation spaces may include a first separation space between the (1-1)th bent portion and the (2-1)th bent portion, a second separation space between the (2-2)th bent portion and the (3-1)th bent portion, and a third separation space between the (1-2)th bent portion and the (3-2)th bent portion.

The (1-1)th bent portion may be bent in an opposite direction to the (1-2)th bent portion, the (2-1)th bent portion is bent in an opposite direction to the (2-2)th bent portion, and the (3-1)th bent portion is bent in an opposite direction to the (3-2)th bent portion.

The signal transmission lines may include a first line including a first bent portion positioned in a first row, a second line including a second bent portion positioned in a second row adjacent to the first row, a third line including a third bent portion positioned in a third row adjacent to the second row, and a fourth line including a fourth bent portion positioned in a fourth row adjacent to the third row.

The separation spaces may include a first separation space between the first bent portion and the second line adjacent to the first bent portion, a second separation space between the second bent portion and the third line adjacent to the second bent portion, a third separation space between the third bent portion and the fourth line, and a fourth separation space between the fourth bent portion and another first line of the signal transmission lines that is adjacent to the fourth bent portion.

The first, second, third, and fourth bent portions may be bent in a same direction.

The signal transmission lines may include a first line including a first bent portion positioned in a first row, a second line including a second bent portion positioned in a second row adjacent to the first row, a third line including a third bent portion positioned in the first row, and a fourth line including a fourth bent portion positioned in the second row.

The separation spaces may include a first separation space between the first bent portion and the second line, a second separation space between the second bent portion and the third line, a third separation space between the third bent portion and the fourth line, and a fourth separation space between the fourth bent portion and another first line of the signal transmission lines.

The first, second, third, and fourth bent portions may be bent in a same direction.

The signal transmission lines may include a first line including a (1-1)th bent portion positioned in a first row, and a (1-2)th bent portion positioned in a fourth row, a second line including a (2-1)th bent portion positioned in the first row, and a (2-2)th bent portion positioned in a second row adjacent to the first row, a third line including a (3-1)th bent portion positioned in the second row, and a (3-2)th bent portion positioned in a third row adjacent to the second row, and a fourth line including a (4-1)th bent portion positioned in the third row, and a (4-2)th bent portion positioned in the fourth row.

The separation spaces may include a first separation space between the (2-1)th bent portion and the third line, a second separation space between the (3-1)th bent portion and the fourth line, a third separation space between the (4-1)th bent portion and another first line of the signal transmission lines that is adjacent to the (4-1)th bent portion, and a fourth separation space between the (1-2)th bent portion and another second line of the signal transmission lines that is adjacent to the (1-2)th bent portion.

The (1-1)th bent portion and the (2-1)th bent portion may be bent in a same direction, the (2-2)th bent portion and the (3-1)th bent portion may be bent in a same direction, the (3-2)th bent portion and the (4-1)th bent portion may be bent in a same direction, and the (1-2)th bent portion and the (4-2)th bent portion may be bent in a same direction.

The signal transmission lines may include a first line including a (1-1)th bent portion positioned in a first row, another first line including a (1-2)th bent portion positioned in a second row adjacent to the first row, a (1-3)th bent portion positioned in a third row adjacent to the second row, and a (1-4)th bent portion positioned in a fourth row adjacent to the third row, a second line including a (2-1)th bent portion positioned in the first row, and a (2-2)th bent portion positioned in the second row, another second line including a (2-3)th bent portion positioned in the third row, a third line including a (3-1)th bent portion positioned in the first row, a (3-2)th bent portion positioned in the second row, and a (3-3)th bent portion positioned in the third row, and a fourth line including a (4-1)th bent portion positioned in the second row, a (4-2)th bent portion positioned in the third row, and a (4-3)th bent portion in the fourth row.

The separation spaces may include a first separation space between the (1-1)th bent portion and the (2-1)th bent portion, which are bent in opposite respective directions, a second separation space between the (2-2)th bent portion and the (3-2)th bent portion, which are bent in opposite respective directions, a third separation space between the (3-3)th bent portion and the (4-2)th bent portion, which are bent in opposite respective directions, and a fourth separation space between the (4-3)th bent portion and the (1-4)th bent portion, which are bent in opposite respective directions.

The display device may further include a transistor including an active layer, a gate electrode, a source electrode, and a drain electrode in the display area, wherein the identification pattern is at a same layer as any one of the active layer, the gate electrode, the source electrode, and the drain electrode.

The at least one identification block may include an identification number or an identification symbol.

Respective sizes of the separation spaces may be the same.

The signal transmission lines may be connected to a data line for providing a data voltage to a pixel structure in the display area.

A display device according to one or more embodiments of the present disclosure may include a plurality of signal transmission lines each extending in a first direction and repeatedly located along a second direction crossing the first direction, a plurality of separation spaces each formed between at least two adjacent signal transmission lines among the signal transmission lines and adjacent to each other in an oblique direction, and an identification pattern including at least one identification block located in each of the separation spaces. Accordingly, the dead space of the display device may be reduced.

BRIEF DESCRIPTION OF THE DRAWINGS

Illustrative, non-limiting embodiments will be more clearly understood from the following detailed description in conjunction with the accompanying drawings.

FIG. 3 is a cross-sectional view illustrating an example of a cross section taken along the line I-I' of FIG. 1 and the line II-II' of FIG. 2.

FIG. 4 is a cross-sectional view illustrating another example of a cross section taken along the line I-I' of FIG. 1 and the line II-II' of FIG. 2.

DETAILED DESCRIPTION

Figure 1:
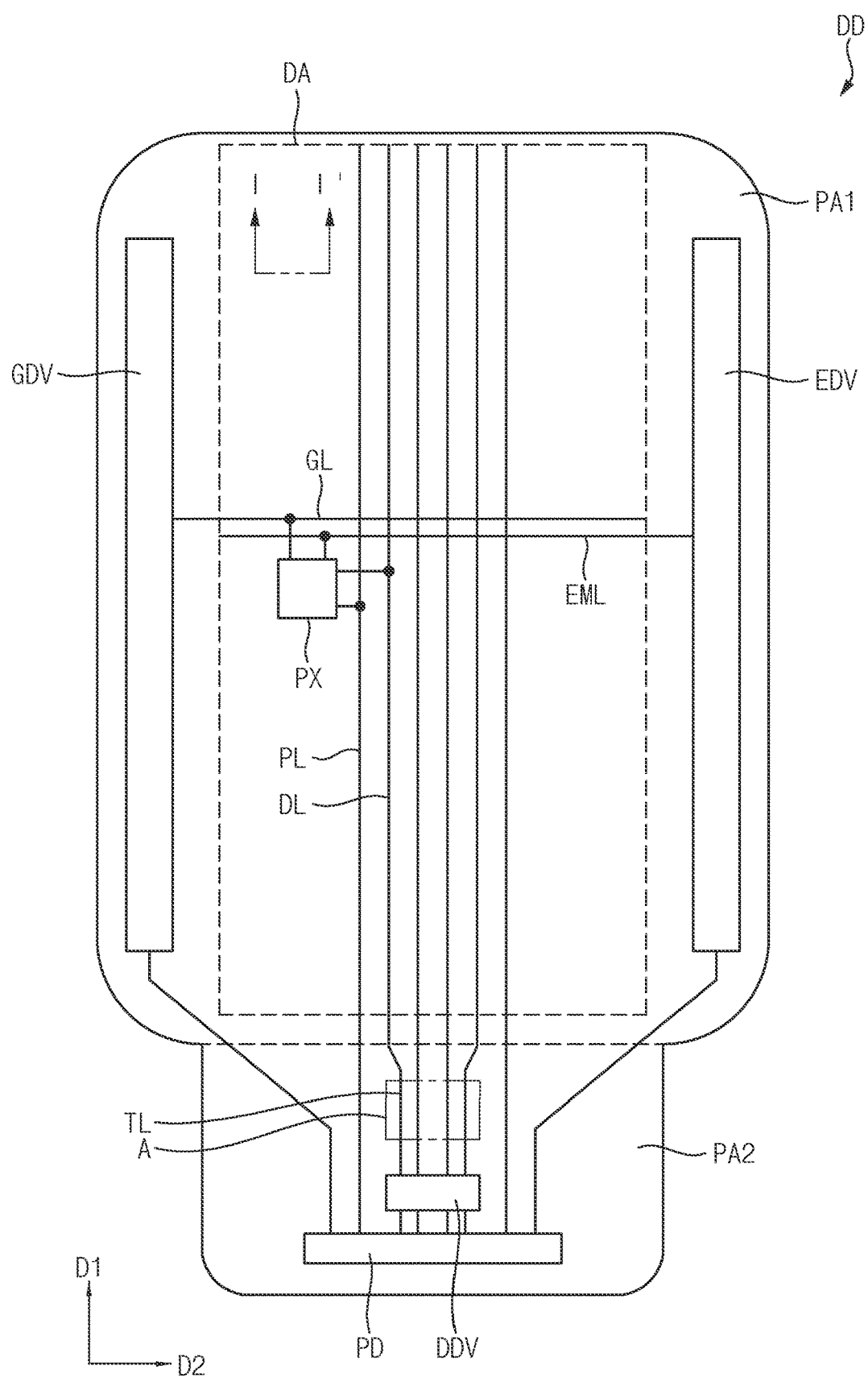
FIG. 1 is a plan view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to one or more embodiments.

Referring to FIG. 1, a display device DD according to one or more embodiments may include a display area DA, a first peripheral area PA1, and a second peripheral area PA2. The first peripheral area PA1 may surround the display area DA. The second peripheral area PA2 may be adjacent to a lower end of the display area DA.

A pixel structure PX may be located in the display area DA, and a driver for driving the pixel structure PX may be located in the first and second peripheral areas PA1 and PA2. For example, a gate driver GDV and a light-emitting driver EDV may be located in the first peripheral area PA1, and a data driver DDV and a pad portion PD may be located in the second peripheral area PA2. A portion of the second peripheral area PA2 may be bent based on a virtual bending axis.

A data line DL, a gate line GL, a light-emitting control line EML, a driving voltage line PL, and a signal transmission line TL connected to the pixel structure PX may be located in the display area DA.

The signal transmission line TL may be electrically connected to the data driver DDV, and may extend along a first direction D1. In addition, the signal transmission line TL may be connected to the data line DL extending in the first direction D1. The signal transmission line TL may receive a data voltage from the data driver DDV, and may provide the data voltage to the data line DL. The data line DL may provide the data voltage to the pixel structure PX.

The gate line GL may be electrically connected to the gate driver GDV, and may extend in a second direction D2 crossing the first direction D1. The gate line GL may receive a gate signal from the gate driver GDV, and may provide the gate signal to the pixel structure PX.

The light-emitting control line EML may be electrically connected to the light-emitting driver EDV, and may extend along the second direction D2. The light-emitting control line EML may receive a light-emitting control signal from the light-emitting driver EDV, and may provide the light-emitting control signal to the pixel structure PX. For example, an active period of the light-emitting control signal may be a light-emitting period of the display device DD, and an inactive period of the light-emitting control signal may be a non-light-emitting period of the display device DD.

The driving voltage line PL may be electrically connected to the pad portion PD, and may extend along the first direction D1. The driving voltage line PL may receive a high power voltage from the pad portion PD, and may provide the high power voltage to the pixel structure PX.

The gate driver GDV may generate the gate signal by receiving a voltage from the pad portion PD. The data driver DDV may generate the data voltages corresponding to the light-emitting period and the non-light-emitting period of the display device DD. The light-emitting driver EDV may generate the light-emitting control signal by receiving a voltage from the pad portion PD. The pad portion PD may be electrically connected to an external device, and may provide voltages to each of the gate driving portion GDV, the light-emitting driving portion EDV, and the driving voltage line PL.

Although the gate driver GDV and the light-emitting driver EDV are located in the first peripheral area PA1 adjacent to the left side of the display area DA and in the first peripheral area PA1 adjacent to the right side of the display area DA, respectively, the present disclosure is not limited thereto. For example, the gate driver GDV and the light-emitting driver EDV may be located at different positions in the first peripheral area PA1.

In addition, although the data driver DDV is illustrated as being mounted in the second peripheral area PA2 of the display device DD in FIG. 1, the present disclosure is not limited thereto. For example, a separate flexible printed circuit board ("FPCB") may be located in the second peripheral area PA2, and the data driver DDV may be located on the flexible printed circuit board. In this case, the pad portion PD may be electrically connected to the flexible printed circuit board.

In this specification, a plane may be defined as the first direction D1, and the second direction D2 crossing the first direction D1. For example, the second direction D2 may be substantially perpendicular to the first direction D1.

Figure 2:
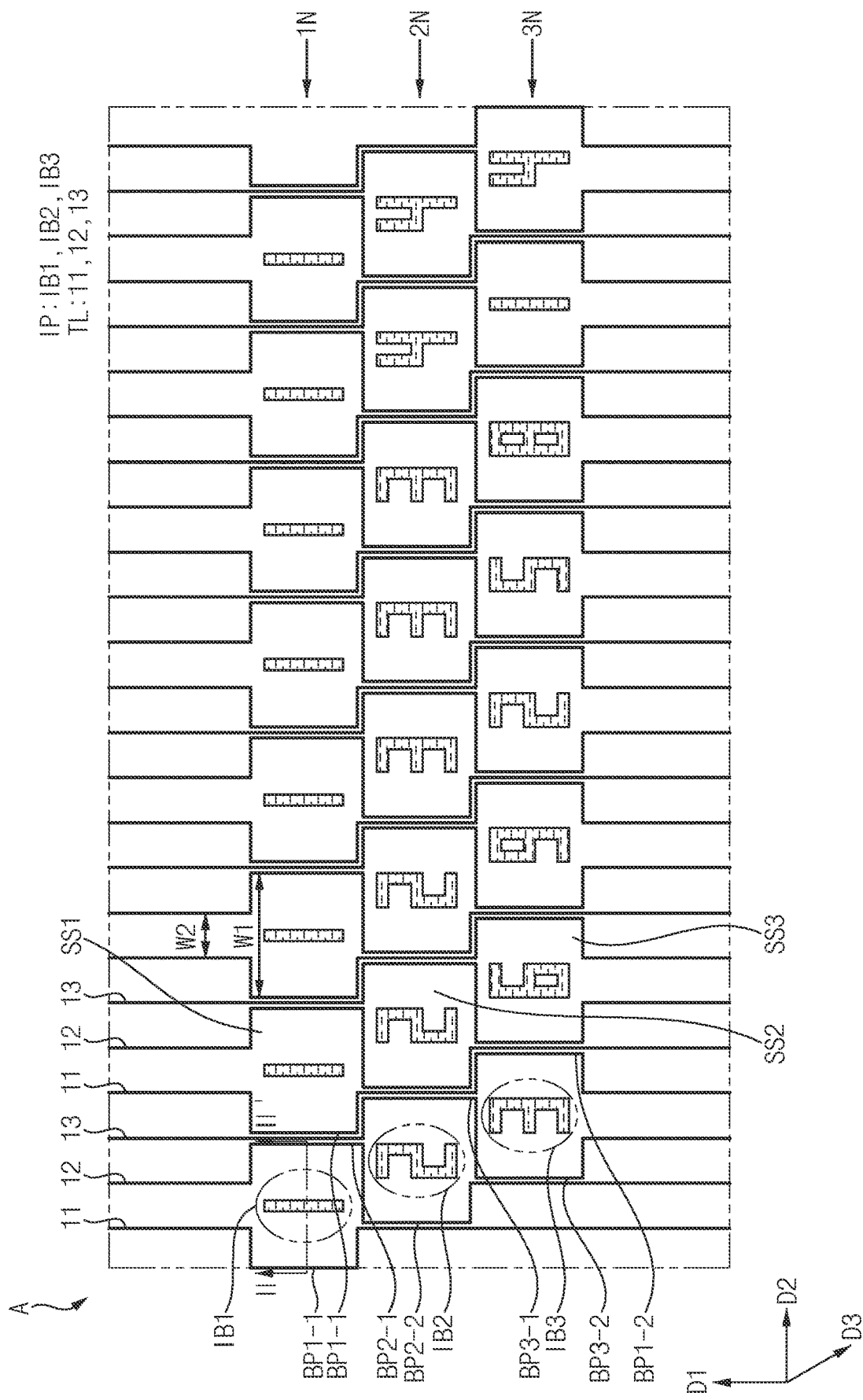
FIG. 2 is an enlarged plan view of an example of the area A of FIG. 1.

FIG. 2 is an enlarged plan view of an example of the area A of FIG. 1.

Referring to FIGS. 1 and 2, the display device DD according to one or more embodiments of the present disclosure may include the signal transmission lines TL, separation spaces SS1, SS2, and SS3, and an identification pattern IP.

The signal transmission lines TL may be located in the second peripheral area PA2. Each of the signal transmission lines TL may extend in the first direction D1. In addition, the signal transmission lines TL may be repeatedly arranged along the second direction D2 crossing the first direction D1.

The signal transmission lines TL may include a plurality of first lines 11, a plurality of second lines 12, and a plurality of third lines 13. For example, a second line 12 may be positioned on the right side of a corresponding first line 11, and a corresponding third line 13 may be positioned on the right side of the second line 12. That is, the second line 12 may be positioned between corresponding ones of the first line 11 and the third line 13.

In one or more embodiments, each of the first lines 11 may include a (1-1)th bent portion BP1-1 positioned in a first row 1N, and a (1-2)th bent portion BP1-2 positioned in a third row 3N. That is, each of the first lines 11 may be bent twice. The (1-1)th bent portion BP1-1 and the (1-2)th bent portion BP1-2 may be bent in opposite respective directions. For example, the (1-1)th bent portion BP1-1 may be bent in a direction that is opposite to the second direction D2, and the (1-2)th bent portion BP1-2 may be bent in the second direction D2. For example, the 1-1 bent portion BP1-1 and the (1-2)th bent portion BP1-2 may be bent in a "C" shape or in a reverse "C" shape.

In one or more embodiments, each of the second lines 12 may include a (2-1)th bent portion BP2-1 positioned in the first row 1N, and a (2-2)th bent portion BP2-2 positioned in the second row 2N adjacent to the first row 1N. That is, each of the second lines 12 may be bent twice. The (2-1)th bent portion BP2-1 and the (2-2)th bent portion BP2-2 may be bent in opposite respective directions. For example, the (2-1)th bent portion BP2-1 may be bent in the second direction D2, and the (2-2)th bent portion BP2-2 may be bent in the direction that is opposite to the second direction D2. For example, the (2-1)th bent portion BP2-1 and the (2-2)th bent portion BP2-2 may be bent in a "C" shape or in a reverse "C" shape.

In one or more embodiments, each of the third lines 13 may include a (3-1)th bent portion BP3-1 positioned in the second row 2N, and a (3-2)th bent portion positioned in positioned in the third row 3N adjacent to the second row 2N. That is, each of the third lines 13 may be bent twice. The (3-1)th bent portion BP3-1 and the (3-2)th bent portion BP3-2 may be bent in opposite respective directions. For example, the (3-1)th bent portion BP3-1 may be bent in the second direction D2, and the (3-2)th bend portion BP3-2 may be bent in the direction that is opposite to the second direction D2. For example, the (3-1)th bent portion BP3-1 and the (3-2)th bent portion BP3-2 may be bent in a "C" shape or in a reverse "C" shape.

One separation space may be formed between at least two adjacent signal transmission lines TL among the signal transmission lines TL. In one or more embodiments, the first separation space SS1 may be formed between the (1-1)th bent portion BP1-1 and the (2-1)th bent portion BP2-1, the second separation space SS2 may be formed between the (2-2)th bent portion BP2-2 and the (3-1)th bent portion BP3-1, and the third separation space SS3 may be formed between the (1-2)th bent portion BP1-2 and the (3-2)th bent portion BP3-2.

The identification pattern IP may include at least one identification block. For example, the identification pattern IP may include a first identification block IB1, a second identification block IB2, and a third identification block IB3. For example, each of the first identification block IB1, the second identification block IB2, and the third identification block IB3 may include an identification number or identification symbol. Positions of the signal transmission lines TL may be detected through the identification pattern IP.

The first identification block IB1 may be located in the first separation space SS1, the second identification block IB2 may be located in the second separation space SS2, and the third identification block IB3 may be located in the third separation space SS3. That is, one identification block may be located in one separation space. However, the present disclosure is not limited thereto, and two or more identification blocks may be located in one separation space.

A first width W1 of each of the separation spaces SS1, SS2, and SS3 may be different from a second width W2 of a space between two adjacent signal transmission lines TL, in which the identification pattern IP is not located, among the signal transmission lines TL. In one or more embodiments, the first width W1 of each of the separation spaces SS1, SS2, and SS3 may be greater than the second width W2 of the space between two adjacent signal transmission lines TL, in which the identification pattern IP is not located.

In one or more embodiments, the separation spaces SS1, SS2, and SS3 may be adjacent to each other in an oblique direction (e.g., a third direction D3) that is between the second direction D2 and a direction that is opposite to the first direction D1.

Accordingly, the second identification block IB2 located in the second separation space SS2 may be adjacent to the first identification block IB1 located in the first separation space SS1 in the oblique direction, and the third identification block IB3 located in the third separation space SS3 may be adjacent to the second identification block IB2 located in the second separation space SS2 in the oblique direction. As the separation spaces SS1, SS2, and SS3 are adjacent to each other in the oblique direction, the dead space of the display device DD may be reduced.

The separation spaces SS1, SS2, and SS3 may have substantially similar sizes. In one or more embodiments, the separation spaces SS1, SS2, and SS3 may have substantially the same size.

Figure 5:
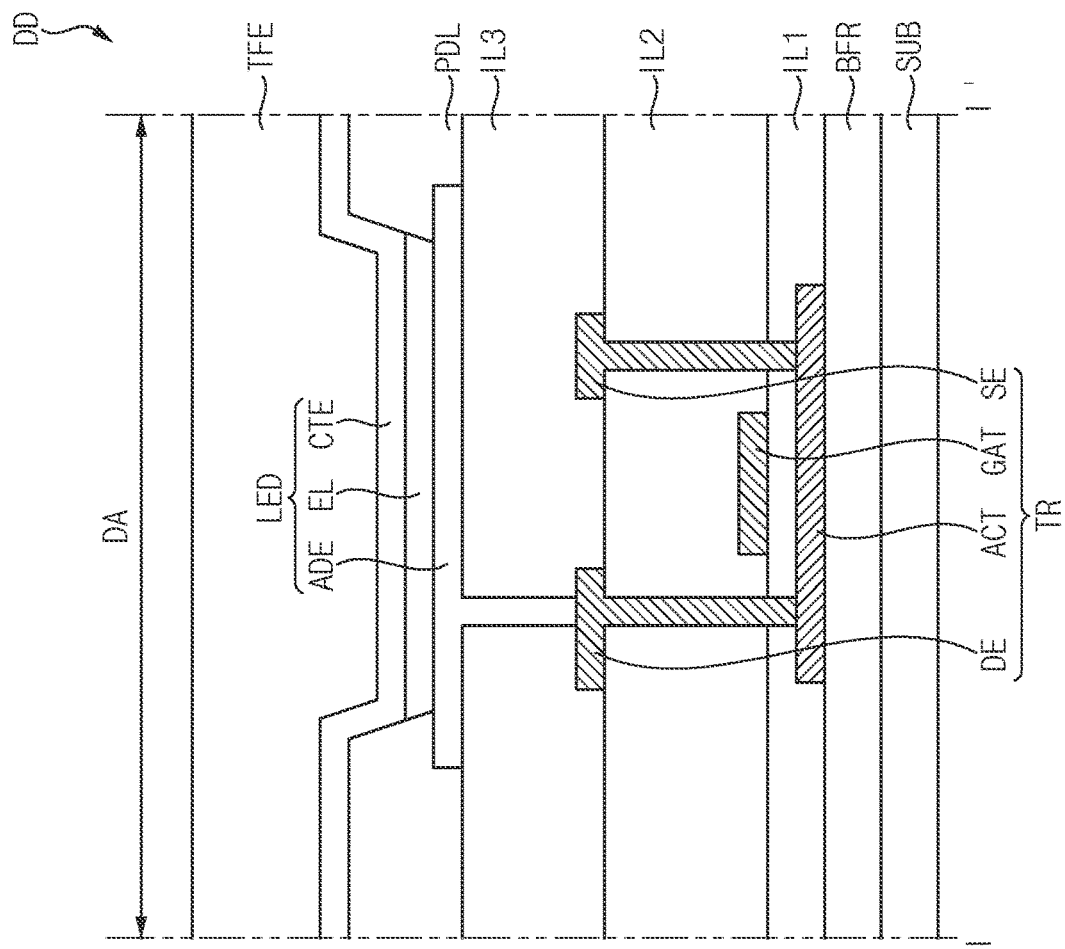
FIG. 5 is a cross-sectional view illustrating another example of a cross section taken along the line I-I' of FIG. 1 and the line II-II' of FIG. 2.

FIG. 3 is a cross-sectional view illustrating an example of a cross section taken along the line I-I' of FIG. 1 and the line II-II' of FIG. 2. FIG. 4 is a cross-sectional view illustrating another example of a cross section taken along the line I-I' of FIG. 1 and the line II-II' of FIG. 2. FIG. 5 is a cross-sectional view illustrating another example of a cross section taken along the line I-I' of FIG. 1 and the line II-II' of FIG. 2. For example, FIGS. 3, 4, and 5 are enlarged cross-sectional views of a portion of the display area DA and a portion of the second peripheral area PA2 of the display device DD.

Referring to FIGS. 3, 4, and 5, the display device DD according to one or more embodiments may include a substrate SUB, a buffer layer BUF, a first insulating layer IL1, a transistor TR, a second insulating layer IL2, a third insulating layer IL3, a pixel defining layer PDL, a light-emitting element LED, an encapsulation layer TFE, a signal transmission line TL, and an identification pattern IP.

Here, the transistor TR may include an active pattern ACT, a gate electrode GAT, a source electrode SE, and a drain electrode DE. The light-emitting element LED may include an anode electrode ADE, a light-emitting layer EL, and a cathode electrode CTE.

The substrate SUB may include a transparent material or an opaque material. The substrate SUB may be made of a transparent resin substrate. Examples of the transparent resin substrate include polyimide substrates and the like. In this case, the polyimide substrate may include a first organic layer, a first barrier layer, and a second organic layer. Alternatively, the substrate SUB may include a quartz substrate, a synthetic quartz substrate, a calcium fluoride substrate, an F-doped quartz substrate, a soda-lime glass substrate, a non-alkali glass substrate, and the like. These may be used alone or in combination with each other.

The buffer layer BUF may be located on the substrate SUB. The buffer layer BUF may reduce or prevent diffusion of metal atoms or impurities from the substrate SUB into the transistor TR. In addition, the buffer layer BUF may improve flatness of the surface of the substrate SUB when the surface of the substrate SUB is not uniform. For example, the buffer layer BUF may include an inorganic material, such as silicon oxide, silicon nitride, silicon oxynitride, and the like. These may be used alone or in combination with each other.

The active pattern ACT may be located in the display area DA on the buffer layer BUF. The active pattern ACT may include a metal oxide semiconductor, an inorganic semiconductor (e.g., amorphous silicon, poly silicon), or an organic semiconductor. The active pattern ACT may include a source region, a drain region, and a channel region positioned between the source region and the drain region.

The metal oxide semiconductor may include a two-component compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like. These may be used alone or in combination with each other.

The first insulating layer IL1 may be located on the buffer layer BUF. The first insulating layer IL1 may continuously extend from the display area DA to the second peripheral area PA2. The first insulating layer IL1 may sufficiently cover the active pattern ACT, and may have a substantially flat upper surface without creating a step around the active pattern ACT. Alternatively, the first insulating layer IL1 may cover the active pattern ACT, and may be located along the profile of each of the active pattern ACT with a uniform thickness. For example, the first insulating layer IL1 may include an inorganic material, such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), and the like. These may be used alone or in combination with each other.

The gate electrode GAT may be located in the display area DA on the first insulating layer IL1. The gate electrode GAT may overlap the channel region of the active pattern ACT. The gate electrode GAT may include a metal, an alloy, a metal nitride, a conductive metal oxide, a transparent conductive material, and the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and the like. Examples of the conductive metal oxide include indium tin oxide and indium zinc oxide. In addition, examples of the metal nitride may include aluminum nitride ("$AlN_x$"), tungsten nitride ("$WN_x$"), chromium nitride ("$CrN_x$"), and the like. These may be used individually or in combination with each other.

The signal transmission line TL may be located in the second peripheral area PA2 on the first insulating layer IL1. In one or more embodiments, the signal transmission line TL may be located at the same layer as the gate electrode GAT. That is, the signal transmission line TL may be formed through the same process as the gate electrode GAT and may include the same material.

The second insulating layer IL2 may be located on the first insulating layer IL1. The second insulating layer IL2 may continuously extend from the display area DA to the second peripheral area PA2. The second insulating layer IL2 may sufficiently cover the gate electrode GAT, and may have a substantially flat top surface without creating a step around the gate electrode GAT. Alternatively, the second insulating layer IL2 may cover the gate electrode GAT, and may be located along the profile of each gate electrode GAT to have a uniform thickness. For example, the second insulating layer IL2 may include an inorganic material, such as silicon oxide, silicon nitride, silicon carbide, silicon oxynitride, silicon oxycarbide, and the like. These may be used alone or in combination with each other.

The source electrode SE and the drain electrode DE may be located in the display area DA on the second insulating layer IL2. The source electrode SE may be connected to the source region of the active pattern ACT through a contact hole passing through the second insulating layer IL2. The drain electrode DE may be connected to the drain region of the active pattern ACT through a contact hole passing through the second insulating layer IL2. For example, each of the source electrode SE and the drain electrode DE may include a metal, an alloy, a metal nitride, a conductive metal oxide, a transparent conductive material, and the like. These may be used alone or in combination with each other.

Accordingly, the transistor TR including the active pattern ACT, the gate electrode GAT, the source electrode SE, and the drain electrode DE may be located in the display area DA on the substrate SUB.

In one or more embodiments, as illustrated in FIG. 3, the identification pattern IP may be located on the buffer layer BUF. That is, the identification pattern IP may be located at the same layer as the active pattern ACT. In other words, the identification pattern IP may be formed through the same process as the active pattern ACT and may include the same material.

In one or more other embodiments, as illustrated in FIG. 4, the identification pattern IP may be located on the first insulating layer IL1. That is, the identification pattern IP may be located at the same layer as the gate electrode GAT. In other words, the identification pattern IP may be formed through the same process as the gate electrode GAT and may include the same material.

In one or more other embodiments, as illustrated in FIG. 5, the identification pattern IP may be located on the second insulating layer IL2. That is, the identification pattern IP may be located at the same layer as the source electrode SE and the drain electrode DE. In other words, the identification pattern IP may be formed through the same process as the source electrode SE and the drain electrode DE, and may include the same material.

The third insulating layer IL3 may be located in the display area DA on the second insulating layer IL2. The third insulating layer IL3 may sufficiently cover the source electrode SE and the drain electrode DE. The third insulating layer IL3 may include an inorganic material or an organic material. In one or more embodiments, the third insulating layer IL3 may include an organic material. For example, the third insulating layer IL3 may include an organic material, such as phenolic resin, polyacrylates resin, polyimides rein, polyamides resin, siloxane resin, an epoxy resin, and the like. These may be used alone or in combination with each other.

The anode electrode ADE may be located in the display area DA on the third insulating layer IL3. The anode electrode ADE may be connected to the drain electrode DE through a contact hole passing through the third insulating layer IL3. For example, the anode electrode ADE may include a metal, an alloy, a metal nitride, a conductive metal oxide, a transparent conductive material, and the like. These may be used alone or in combination with each other. In one or more embodiments, the anode electrode ADE may have a stacked structure including ITO/Ag/ITO. For example, the anode electrode ADE may act as an anode.

The pixel defining layer PDL may be located on the third insulating layer IL3. The pixel defining layer PDL may cover both sides of the anode electrode ADE. In addition, an opening exposing at least a portion of an upper surface of the anode electrode ADE may be defined in the pixel defining layer PDL. For example, the pixel defining layer PDL may include an inorganic material or an organic material. In one or more embodiments, the pixel defining layer PDL may include an organic material, such as an epoxy resin or a siloxane resin. These may be used alone or in combination with each other. In one or more other embodiments, the pixel defining layer PDL may further include a light blocking material containing a black pigment or black dye.

The light-emitting layer EL may be located on the anode electrode ADE. For example, the light-emitting layer EL may be located in the opening of the pixel defining layer PDL. The light-emitting layer EL may include an organic material that emits light of a corresponding color/preset color. For example, the light-emitting layer EL may include an organic material that emits red light, green light, or blue light.

The cathode electrode CTE may be located on the pixel defining layer PDL and the light-emitting layer EL. For example, the cathode electrode CTE may include a metal, an alloy, a metal nitride, a conductive metal oxide, a transparent conductive material, and the like. These may be used alone or in combination with each other.

Accordingly, the light-emitting element LED including the anode electrode ADE, the light-emitting layer EL, and the cathode electrode CTE may be located in the display area DA on the substrate SUB.

The encapsulation layer TFE may be located on the cathode electrode CTE. The encapsulation layer TFE may reduce or prevent impurities, moisture, and the like from penetrating into the light-emitting element LED from the outside. The encapsulation layer TFE may include at least one inorganic layer and at least one organic layer. For example, the inorganic layer may include silicon oxide, silicon nitride, silicon oxynitride, and the like. These may be used alone or in combination with each other. The organic layer may include a polymer cured material, such as polyacrylate.

Figure 6:
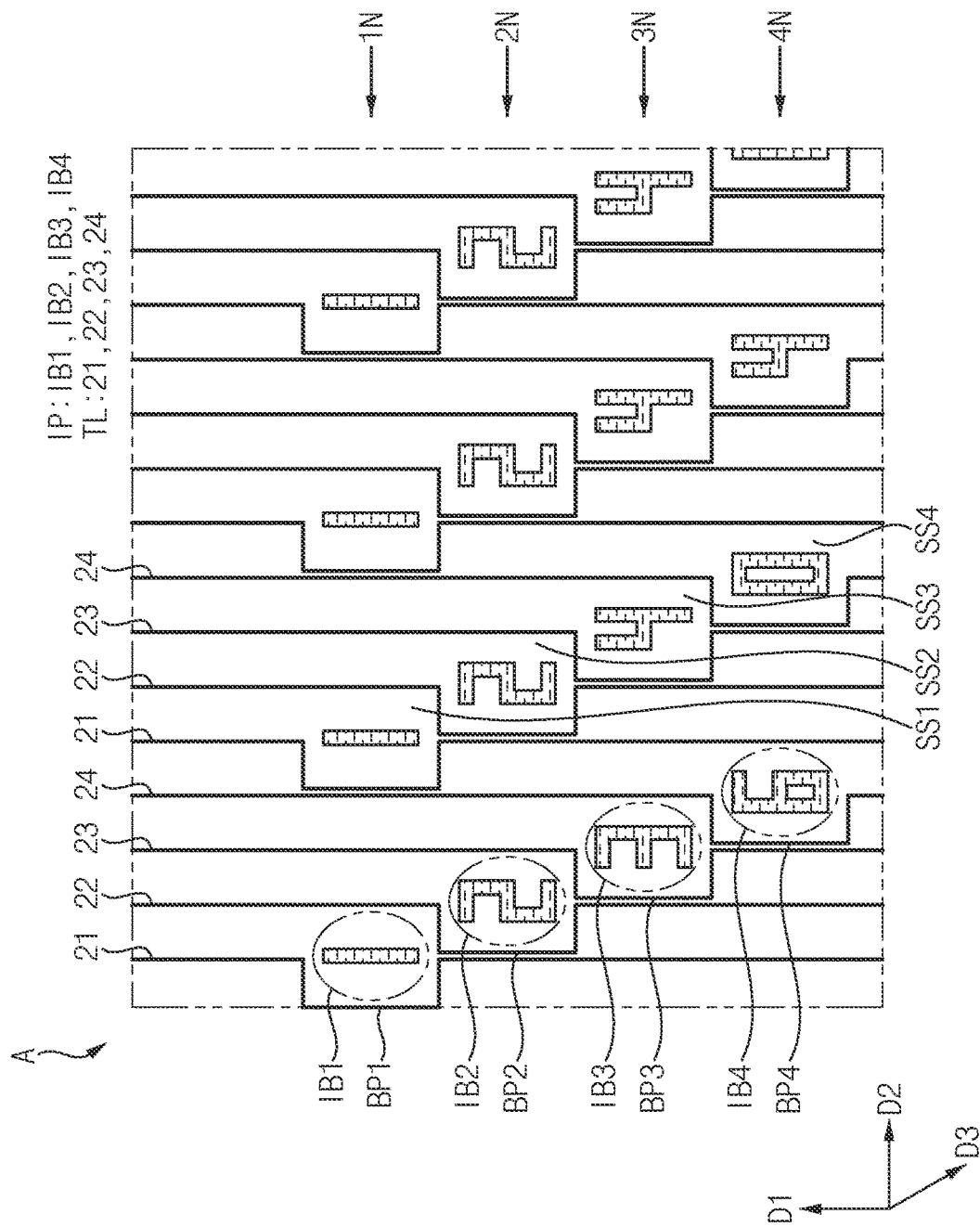
FIG. 6 is an enlarged plan view of another example of the area A of FIG. 1.

FIG. 6 is an enlarged plan view of another example of the area A of FIG. 1.

Referring to FIGS. 1 and 6, the display device DD may include signal transmission lines TL, separation spaces SS1, SS2, SS3, and SS4, and an identification pattern IP. Hereinafter, descriptions overlapping those described with reference to FIGS. 1 and 2 will be omitted or simplified.

The signal transmission lines TL may include a plurality of first lines 21, a plurality of second lines 22, a plurality of third lines 23, and a plurality of fourth lines 24. For example, the second line 22 may be positioned on the right side of the adjacent first line 21, the third line 23 may be positioned on the right side of the second line 22, and the fourth line 24 be positioned on the right side of the third line 23. That is, the second line 22 may be positioned between the first line 21 and the third line 23 that are adjacent thereto, and the third line 23 may be positioned between the second line 22 and the fourth line 24 that are adjacent thereto.

In one or more embodiments, each of the first lines 21 may include a first bent portion BP1 positioned in a first row 1N. That is, each of the first lines 21 may be bent once. The first bent portion BP1 may be bent in a direction that is opposite to the second direction D2. For example, the first bent portion BP1 may be bent in a "C" shape.

In one or more embodiments, each of the second lines 22 may include a second bent portion BP2 positioned in a second row 2N adjacent to the first row 1N. That is, each of the second lines 22 may be bent once. The second bent portion BP2 may be bent in a direction that is opposite to the second direction D2. For example, the second bent portion BP2 may be bent in a "C" shape.

In one or more embodiments, each of the third lines 23 may include a third bent portion BP3 positioned in a third row 3N adjacent to the second row 2N. That is, each of the third lines 23 may be bent once. The third bent portion BP3 may be bent in a direction that is opposite to the second direction D2. For example, the third bent portion BP3 may be bent in a "C" shape.

In one or more embodiments, each of the fourth lines 24 may include a fourth bent portion BP4 positioned in a fourth row 4N adjacent to the third row 3N. That is, each of the fourth lines 24 may be bent once. The fourth bent portion BP4 may be bent in a direction that is opposite to the second direction D2. For example, the fourth bent portion BP4 may be bent in a "C" shape.

That is, the first, second, third, and fourth bent portions BP1, BP2, BP3, and BP4 may be bent in the same direction (e.g., in a direction that is opposite to the second direction D2).

In one or more embodiments, a first separation space SS1 may be formed between the first bent portion BP1 and one second line 22 adjacent to the first bent portion BP1 among the second lines 22, a second separation space SS2 may be formed between the second bent portion BP2 and one third line 23 adjacent to the second bent portion BP2 among the third lines 23, a third separation space SS3 may be formed between the fourth bent portion BP4 and one fourth line 24 adjacent to the fourth bent portion BP4 among the fourth lines 24, and a fourth separation space SS4 may be formed between the fourth bent portion BP4 and one first line 21 adjacent to the fourth bent portion BP4 among the first lines 21.

The identification pattern IP may include at least one identification block. For example, the identification pattern IP may include a first identification block IB1, a second identification block IB2, a third identification block IB3, and a fourth identification block IB4. For example, each of the first identification block IB1, the second identification block IB2, the third identification block IB3, and the fourth identification block IB4 may include an identification number or identification symbol.

The first identification block IB1 may be located in the first separation space SS1, the second identification block IB2 may be located in the second separation space SS2, and the third identification block IB3 may be located in the third separation space SS3, and the fourth identification block IB4 may be located in the fourth separation space SS4. However, the present disclosure is not limited thereto, and two or more identification blocks may be located in one separation space.

In one or more embodiments, the separation spaces SS1, SS2, SS3, and SS4 may be adjacent to each other in an oblique direction (e.g., the third direction D3) between the second direction D2 and a direction that is opposite to the first direction D1. Accordingly, the dead space of the display device DD may be reduced.

Figure 7:
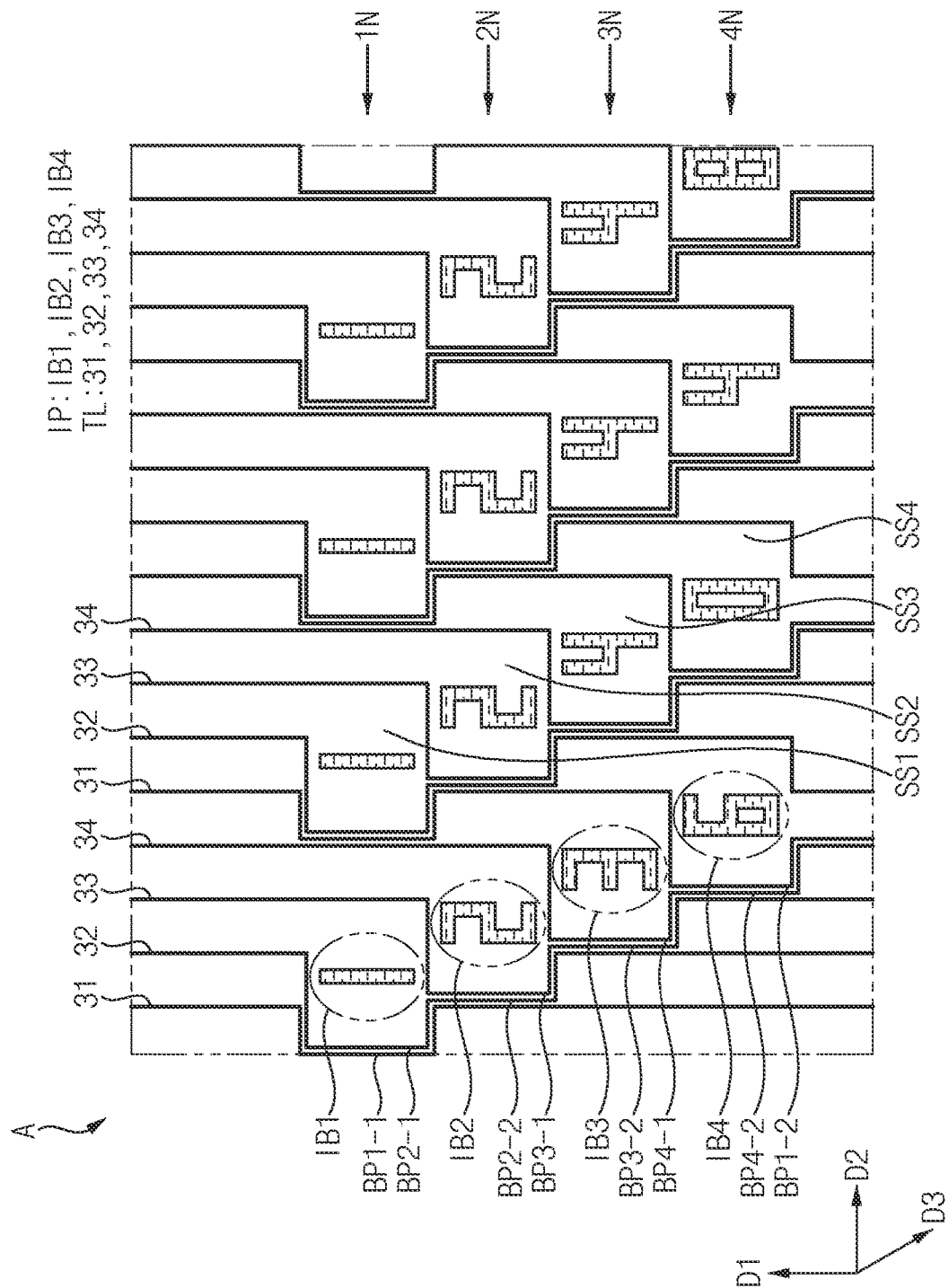
FIG. 7 is an enlarged plan view of another example of the area A of FIG. 1.

FIG. 7 is an enlarged plan view of another example of the area A of FIG. 1.

Referring to FIGS. 1 and 7, the display device DD may include signal transmission lines TL, separation spaces SS1, SS2, SS3, and SS4, and an identification pattern IP. Hereinafter, descriptions overlapping those described with reference to FIGS. 1, 2, and 6 will be omitted or simplified.

The signal transmission lines TL may include a plurality of first lines 31, a plurality of second lines 32, a plurality of third lines 33, and a plurality of fourth lines 34. For example, the second line 32 may be positioned on the right side of the first line 31 that is adjacent thereto, the third line 33 may be positioned on the right side of the second line 32, and the fourth line 34 may be positioned on the right side of the third line 33. That is, the second line 32 may be positioned between the first line 31 and the third line 33 that are adjacent thereto, and the third line 33 may be positioned between the second line 32 and the fourth line 34 that are adjacent thereto.

In one or more embodiments, each of the first lines 31 may include a (1-1)th bent portion BP1-1 positioned in a first row 1N and a (1-2)th bent portion BP1-2 positioned in a fourth row 4N. That is, each of the first lines 31 may be bent twice. The (1-1)th bent portion BP1-1 and the (1-2)th bent portion BP1-2 may be bent in the same direction. For example, each of the (1-1)th bent portion BP1-1 and the (1-2)th bent portion BP1-2 may be bent in a direction that is opposite to the second direction D2. For example, each of the (1-1)th bent portion BP1-1 and the (1-2)th bent portion BP1-2 may be bent in a "C" shape.

In one or more embodiments, each of the second lines 32 includes a (2-1)th bent portion BP2-1 positioned in the first row 1N and a (2-2)th bent portion BP2-2 positioned in a second row 2N adjacent to the first row 1N. That is, each of the second lines 32 may be bent twice. The (2-1)th bent portion BP2-1 and the (2-2)th bent portion BP2-2 may be bent in the same direction. For example, each of the (2-1)th bent portion BP2-1 and the (2-2)th bent portion BP2-2 may be bent in a direction that is opposite to the second direction D2. For example, the (2-1)th bent portion BP2-1 may be bent in a "C" shape.

In one or more embodiments, each of the third lines 33 may include a (3-1)th bent portion BP3-1 positioned in the second row 2N and a (3-2)th bent portion BP3-2 positioned in a third row 3N adjacent to the second row 2N. That is, each of the third lines 33 may be bent twice. The (3-1)th bent portion BP3-1 and the (3-2)th bent portion BP3-2 may be bent in the same direction. For example, each of the (3-1)th bent portion BP3-1 and the (3-2)th bent portion BP3-2 may be bent in a direction that is opposite to the second direction D2. For example, the (3-1)th bent portion BP3-1 may be bent in a "C" shape.

In one or more embodiments, each of the fourth lines 34 may include a (4-1)th bent portion BP4-1 positioned in the third row 3N and a (4-2)th bent portion BP4-2 positioned in the fourth row 4N. That is, each of the fourth lines 34 may be bent twice. The (4-1)th bent portion BP4-1 and the (4-2)th bent portion BP4-2 may be bent in the same direction. For example, the (4-1)th bent portion BP4-1 and the (4-2)th bent portion BP4-2 may be bent in a direction that is opposite to the second direction D2. For example, the (4-1)th bent portion BP4-1 may be bent in a "C" shape.

That is, the bent portions BP1-1, BP1-2, BP2-1, BP2-2, BP3-1, BP3-2, BP4-1, and BP4-2 may be bent in the same direction (e.g., in a direction that is opposite to the second direction D2).

In one or more embodiments, the (1-1)th bent portion BP1-1 may be bent along the profile of the (2-1)th bent portion BP2-1. The (2-2)th bent portion BP2-2 may be bent along a portion of the profile of the (3-1)th bent portion BP3-1. The (3-2)th bent portion BP3-2 may be bent along a portion of the profile of the (4-1)th bent portion BP4-1. The (4-2)th bent portion BP4-2 may be bent along a portion of the profile of the (1-2)th bent portion BP1-2.

In one or more embodiments, a first separation space SS1 may be formed between the (2-1)th bent portion BP2-1 and one third line 33 adjacent to the (2-1)th bent portion BP2-1 among the third lines 33, a second separation space SS2 may be formed between the (3-1)th bent portion BP3-1 and one fourth line 34 adjacent to the (3-1)th bent portion BP3-1 among the fourth lines 34, a third separation space SS3 may be formed between the (4-1)th bent portion BP4-1 and one first line 31 adjacent to the (4-1)th bent portion BP4-1 among the first lines 31, and a fourth separation space SS4 may be formed between the (1-2)th bent portion BP1-2 and one second line 32 adjacent to the (1-2)th bent portion BP1-2 among the second lines 32.

The identification pattern IP may include at least one identification block. For example, the identification pattern IP may include a first identification block IB1, a second identification block IB2, a third identification block IB3, and a fourth identification block IB4.

The first identification block IB1 may be located in the first separation space SS1, the second identification block IB2 may be located in the second separation space SS2, the third identification block IB3 may be located in the third separation space SS3, and the fourth identification block IB4 may be located in the fourth separation space SS4. However, the present disclosure is not limited thereto, and two or more identification blocks may be located in one separation space.

In one or more embodiments, the separation spaces SS1, SS2, SS3, and SS4 may be adjacent to each other in an oblique direction (e.g., the third direction D3) between the second direction D2 and a direction that is opposite to the first direction D1. Accordingly, the dead space of the display device DD may be reduced.

Figure 8:
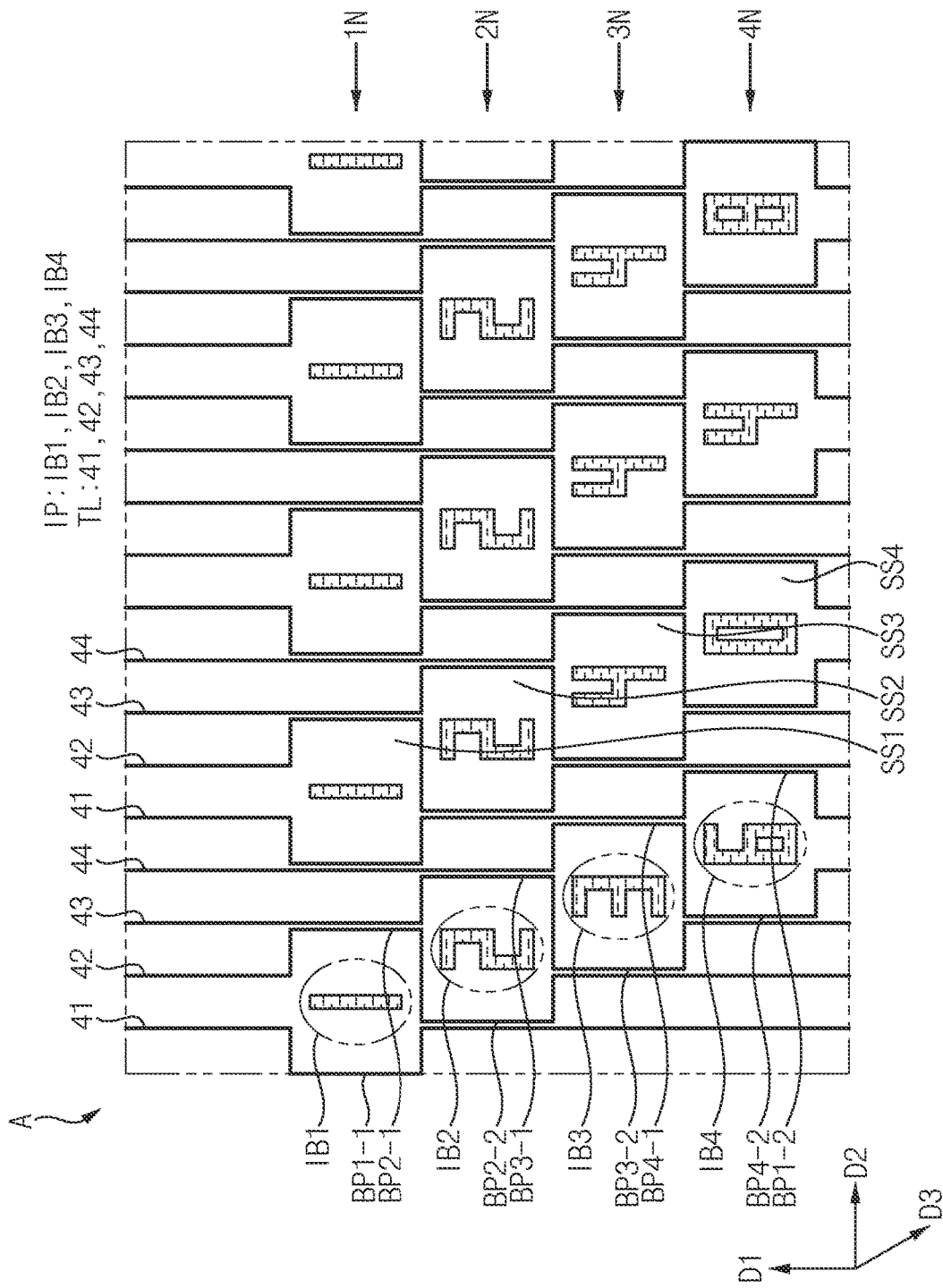
FIG. 8 is an enlarged plan view of another example of the area A of FIG. 1.

FIG. 8 is an enlarged plan view of another example of the area A of FIG. 1.

Referring to FIGS. 1 and 8, the display device DD may include signal transmission lines TL, separation spaces SS1, SS2, SS3, and SS4, and an identification pattern IP. Hereinafter, repeated descriptions overlapping those described with reference to FIGS. 1, 2, and 6 will be omitted or simplified.

The signal transmission lines TL may include a plurality of first lines 41, a plurality of second lines 42, a plurality of third lines 43, and a plurality of fourth lines 44. For example, the second line 42 may be positioned on the right side of the first line 41 adjacent thereto, the third line 43 may be positioned on the right side of the second line 42, and the fourth line 44 may be positioned on the right side of the third line 43. That is, the second line 42 may be positioned between the first line 41 and the third line 43 that are adjacent thereto, and the third line 43 may be positioned between the second line 42 and the fourth line 44 that are adjacent thereto.

In one or more embodiments, each of the first lines 41 may include a (1-1)th bent portion BP1-1 positioned in a first row 1N and a (1-2)th bent portion BP1-2 positioned in a fourth row 4N. That is, each of the first lines 41 may be bent twice. The (1-1)th bent portion BP1-1 may be bent in a direction that is opposite to the second direction D2, and the (1-2)th bent portion BP1-2 may be bent in the second direction D2. For example, each of the (1-1)th bent portion BP1-1 and the (1-2)th bent portion BP1-2 may be bent in a "C" shape or a reverse "C" shape.

In one or more embodiments, each of the second lines 42 may include a (2-1)th bent portion BP2-1 positioned in the first row 1N and a (2-2)th bent portion BP2-2 positioned in a second row 2N adjacent to the first row 1N. That is, each of the second lines 42 may be bent twice. The (2-1)th bent portion BP2-1 may be bent in the second direction D2, and the (2-2)th bent portion BP2-2 may be bent in a direction that is opposite to the second direction D2. For example, the (2-1)th bent portion BP2-1 may be bent in a "C" shape or a reverse "C" shape.

In one or more embodiments, each of the third lines 43 may include a (3-1)th bent portion BP3-1 positioned in the second row 2N and a (3-2)th bent portion BP3-2 positioned in a third row 3N adjacent to the second row 2N. That is, each of the third lines 43 may be bent twice. The (3-1)th bent portion BP3-1 may be bent in the second direction D2, and the (3-2)th bent portion BP3-2 may be bent in a direction that is opposite to the second direction D2. For example, each of the (3-1)th bent portion BP3-1 and the (3-2)th bent portion BP3-2 may be bent in a "C" shape or a reverse "C" shape.

In one or more embodiments, each of the fourth lines 44 may include a (4-1)th bent portion BP4-1 positioned in the third row 3N and a (4-2)th bent portion BP4-1 positioned in the fourth row 4N. That is, each of the fourth lines 44 may be bent twice. The (4-1)th bent portion BP4-1 may be bent in the second direction D2, and the (4-2)th bent portion BP4-2 may be bent in a direction that is opposite to the second direction D2. For example, each of the (4-1)th bent portion BP4-1 and the (4-2)th bent portion BP4-2 may be bent in a "C" shape or a reverse "C" shape.

In one or more embodiments, a first separation space SS1 may be formed between the (1-1)th bent portion BP1-1 and (2-1)th bent portion BP2-1, a second separation space SS2 may be formed between the (2-2)th bent portion BP2-2 and the (3-1)th bent portion BP3-1, a third separation space SS3 may be formed between the (3-2)th bent portion BP3-2 and the (4-1)th bent portion BP4-1, and a fourth separation space SS4 may be formed between the (4-2)th bent portion BP4-2 and the (1-2)th bent portion BP1-2.

The identification pattern IP may include at least one identification block. For example, the identification pattern IP may include a first identification block 161, a second identification block IB2, a third identification block IB3, and a fourth identification block IB4.

The first identification block 161 may be located in the first separation space SS1, the second identification block IB2 may be located in the second separation space SS2, and the third identification block IB3 may be located in the third separation space SS3, and the fourth identification block IB4 may be located in the fourth separation space SS4. However, the present disclosure is not limited thereto, and two or more identification blocks may be located in one separation space.

In one or more embodiments, the separation spaces SS1, SS2, SS3, and SS4 may be adjacent to each other in an oblique direction between the second direction D2 and a direction that is opposite to the first direction D1. Accordingly, the dead space of the display device DD may be reduced.

Figure 9:
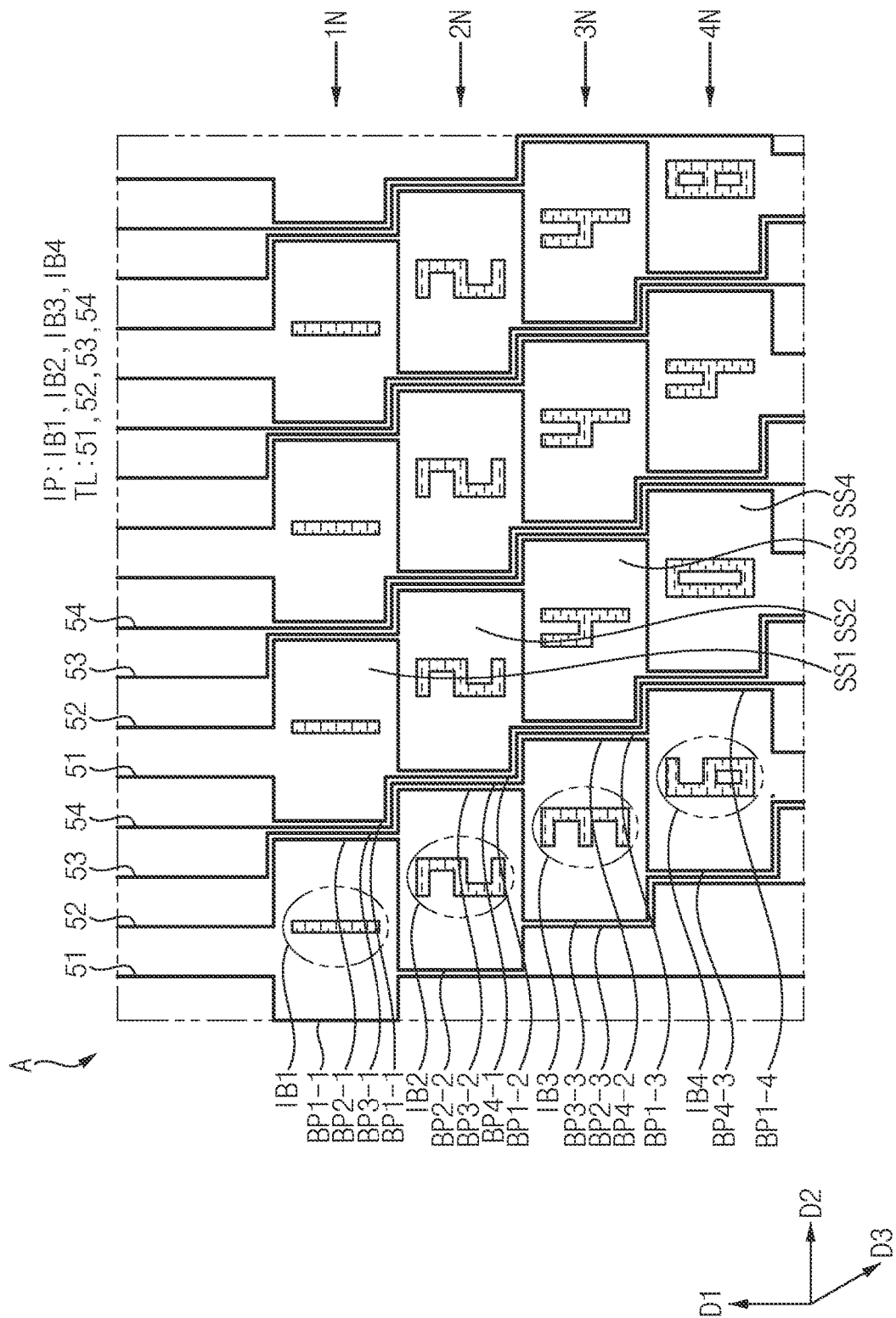
FIG. 9 is an enlarged plan view of another example of the area A of FIG. 1.

FIG. 9 is an enlarged plan view of another example of the area A of FIG. 1.

Referring to FIGS. 1 and 9, the display device DD may include signal transmission lines TL, separation spaces SS1, SS2, SS3, and SS4, and an identification pattern IP. Hereinafter, descriptions overlapping those described with reference to FIGS. 1, 2, and 6 will be omitted or simplified.

The signal transmission lines TL may include a plurality of first lines 51, a plurality of second lines 52, a plurality of third lines 53, and a plurality of fourth lines 54. For example, the second line 52 may be positioned on the right side of the first line 51 adjacent thereto, the third line 53 may be positioned on the right side of the second line 52, and the fourth line 54 may be positioned on the right side of the third line 53. That is, the second line 52 may be positioned between the first line 51 and the third line 53 that are adjacent thereto, and the third line 53 may be positioned between the second line 52 and the fourth line 54 that are adjacent thereto.

In one or more embodiments, each of the first lines 51 may include a (1-1)th bent portion BP1-1 positioned in a first row 1N, a (1-2)th bent portion BP1-2 positioned in a second row 2N adjacent to the first row 1N, a (1-3)th bent portion BP1-3 positioned in a third row 3N adjacent to the second row 2N, and a (1-4)th bent portion BP1-4 positioned in a fourth row 4N adjacent to the third row 3N. That is, each of the first lines 51 may be bent four times. The (1-1)th bend portion BP1-1 may be bent in the same direction as the (1-2)th bent portion BP1-2, and the (1-3)th bent portion BP1-3 may be bent in the same direction as the (1-4)th bent portion BP1-4. For example, the (1-1)th bent portion BP1-1 and the (1-2)th bent portion BP1-2 may be bent in a direction that is opposite to the second direction D2, and the (1-3)th bent portion BP1-3 and the (1-4)th bent portion BP1-4 may be bent in the second direction D2. For example, each of the (1-1)th bent portion BP1-1 and the (1-4)th bent portion BP1-4 may be bent in a "C" shape or in a reverse "C" shape.

In one or more embodiments, each of the second lines 52 may include a (2-1)th bent portion BP2-1 positioned in the first row 1N, a (2-2)th bent portion BP2-2 positioned in the second row 2N, and a (2-3)th bent portion BP2-3 positioned in the third row 3N. That is, each of the second lines 52 may be bent three times. The (2-1)th bent portion BP2-1 may be bent in an opposite direction to the (2-2)th bent portion BP2-2 and the (2-3)th bent portion BP2-3. For example, the (2-1)th bent portion BP2-1 may be bent in the second direction D2, and each of the (2-2)th bent portion BP2-2 and the (2-3)th bent portion BP2-3 may be bent in a direction that is opposite to the second direction D2. For example, each of the (2-1)th bent portion BP2-1 and the (2-2)th bent portion BP2-2 may be bent in a "C" shape or a reverse "C" shape.

In one or more embodiments, each of the third lines 53 may include a (3-1)th bent portion BP3-1 positioned in the first row 1N, a (3-2)th bent portion BP3-2 positioned in the second row 2N, and a (3-3)th bent portion BP3-3 positioned in the third row 3N. That is, each of the third lines 53 may be bent three times. Each of the (3-1)th bent portion BP3-1 and the (3-2)th bent portion BP3-2 may be bent in an opposite direction to the (3-3)th bent portion BP3-3. For example, each of the (3-1)th bent portion BP3-1 and the (3-2)th bent portion BP3-2 may be bent in the second direction D2, and the (3-3)th bent portion BP3-3 may be bent in a direction that is opposite to the second direction D2. For example, each of the (3-2)th bent portion BP3-2 and the (3-3)th bent portion BP3-3 may be bent in a "C" shape or a reverse "C" shape.

In one or more embodiments, each of the fourth lines 54 may include a (4-1)th bent portion BP4-1 positioned in the second row 2N, a (4-2)th bent portion BP4-2 positioned in the third row 3N, and a (4-3)th bent portion BP4-3 positioned in the fourth row 4N. That is, each of the fourth lines 54 may be bent three times. Each of the (4-1)th bent portion BP4-1 and the (4-2)th bent portion BP4-2 may be bent in an opposite direction to the (4-3)th bent portion BP4-3. For example, each of the (4-1)th bent portion BP4-1 and the (4-2)th bent portion BP4-2 may be bent in the second direction D2, and the (4-3)th bent portion BP4-3 may be bent in a direction that is opposite to the second direction D2. For example, each of the (4-2)th bent portion BP4-2 and the (4-3)th bent portion BP4-3 may be bent in a "C" shape or a reverse "C" shape.

In one or more embodiments, the (1-2)th bent portion BP1-2 may be bent along a portion of the profile of the (2-2)th bent portion BP2-2. The (2-3)th bent portion BP2-3 may be bent along a portion of the profile of the (3-3)th bent portion BP3-3. The (3-2)th bent portion BP3-2 may be bent along a portion of the profile of the (2-1)th bent portion BP2-1. The (4-1)th bent portion BP4-1 may be bent along a portion of the profile of the (3-2)th bent portion BP3-2. The (1-3)th bent portion BP1-3 may be bent along a portion of the profile of the (4-2)th bent portion BP4-2.

In one or more embodiments, a first separation space SS1 may be formed between the (1-1)th bent portion BP1-1 and the (2-1)th bent portion BP2-1, a second separation space SS2 may be formed between the (2-2)th bent portion BP2-2 and the (3-2)th bent portion BP3-2, a third separation space SS3 may be formed between the (3-3)th bent portion BP3-3 and the (4-2)th bent portion BP4-2, and a fourth separation space SS4 may be formed between the (4-3)th bent portion BP4-3 and the (1-4)th bent portion BP1-4.

The identification pattern IP may include at least one identification block. For example, the identification pattern IP may include a first identification block 161, a second identification block IB2, a third identification block IB3, and a fourth identification block IB4.

The first identification block 161 may be located in the first separation space SS1, the second identification block IB2 may be located in the second separation space SS2, and the third identification block IB3 may be located in the third separation space SS3, and the fourth identification block IB4 may be located in the fourth separation space SS4. However, the present disclosure is not limited thereto, and two or more identification blocks may be located in one separation space.

In one or more embodiments, the separation spaces SS1, SS2, SS3, and SS4 may be adjacent to each other in an oblique direction (e.g., the third direction D3) between the second direction D2 and a direction that is opposite to the first direction D1. Accordingly, the dead space of the display device DD may be reduced.

Figure 10:
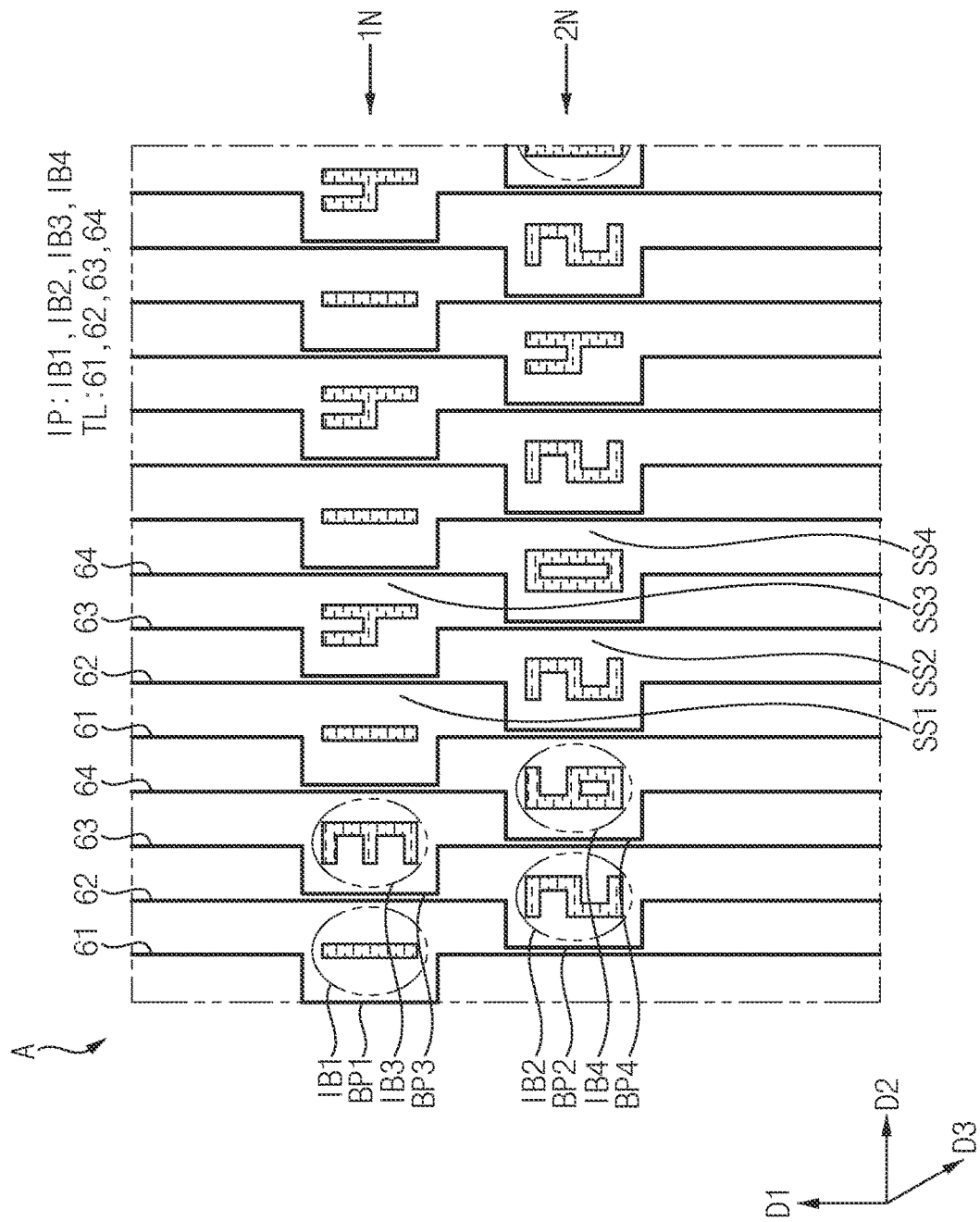
FIG. 10 is an enlarged plan view of another example of the area A of FIG. 1.

FIG. 10 is an enlarged plan view of another example of the area A of FIG. 1.

Referring to FIGS. 1 and 10, the display device DD may include signal transmission lines TL, separation spaces SS1, SS2, SS3, and SS4, and an identification pattern IP. Hereinafter, descriptions overlapping those described with reference to FIGS. 1, 2, and 6 will be omitted or simplified.

The signal transmission lines TL may include a plurality of first lines 61, a plurality of second lines 62, a plurality of third lines 63, and a plurality of fourth lines 64. For example, the second line 62 may be positioned on the right side of the first line 61 that is adjacent thereto, the third line 63 may be positioned on the right side of the second line 62, and the fourth line 64 may be positioned on the right side of the third line 63. That is, the second line 62 the right side of between the first line 61 and the third line 63 that are adjacent thereto, and the third line 63 may be positioned between the second line 62 and the fourth line 64 that are adjacent thereto.

In one or more embodiments, each of the first lines 61 may include a first bent portion BP1 positioned in a first row 1N. That is, each of the first lines 61 may be bent once. The first bent portion BP1 may be bent in a direction that is opposite to the second direction D2. For example, the first bent portion BP1 may be bent in a "C" shape.

In one or more embodiments, each of the second lines 62 may include a second bent portion BP2 positioned in a second row 2N adjacent to the first row 1N. That is, each of the second lines 62 may be bent once. The second bent portion BP2 may be bent in a direction that is opposite to the second direction D2. For example, the second bent portion BP2 may be bent in a "C" shape.

In one or more embodiments, each of the third lines 63 may include a third bent portion BP3 positioned in the first row 1N. That is, each of the third lines 63 may be bent once. The third bent portion BP3 may be bent in a direction that is opposite to the second direction D2. For example, the third bent portion BP3 may be bent in a "C" shape.

In one or more embodiments, each of the fourth lines 64 may include a fourth bent portion BP4 positioned in the second row 2N. That is, each of the fourth lines 64 may be bent once. The fourth bent portion BP4 may be bent in a direction that is opposite to the second direction D2. For example, the fourth bent portion BP4 may be bent in a "C" shape.

That is, the first, second, third, and fourth bent portions BP1, BP2, BP3, and BP4 may be bent in the same direction (e.g., in a direction that is opposite to the second direction D2).

In one or more embodiments, a first separation space SS1 may be formed between the first bent portion BP1 and one second line 62 adjacent to the first bent portion BP1 among the second lines 62, a second separation space SS2 may be formed between the second bent portion BP2 and one third line 63 adjacent to the second bent portion BP2 among the third lines 63, a third separation space SS3 may be formed between the third bent portion BP3 and one fourth line 64 adjacent to the third bent portion BP3 among the fourth lines 64, and a fourth separation space SS4 may be formed between the fourth bent portion BP4 and one first line 61 adjacent to the fourth bent portion BP4 among the first lines 61.

The identification pattern IP may include at least one identification block. For example, the identification pattern IP may include a first identification block IB1, a second identification block IB2, a third identification block IB3, and a fourth identification block IB4.

The first identification block IB1 may be located in the first separation space SS1, the second identification block IB2 may be located in the second separation space SS2, and the third identification block IB3 may be located in the third separation space SS3, and the fourth identification block IB4 may be located in the fourth separation space SS4. However, the present disclosure is not limited thereto, and two or more identification blocks may be located in one separation space.

In one or more embodiments, the separation spaces SS1, SS2, SS3, and SS4 may be adjacent to each other in an oblique direction (e.g., the third direction D3) between the second direction D2 and a direction that is opposite to the first direction D1. Accordingly, the dead space of the display device DD may be reduced.

As illustrated in FIGS. 2, 6, 7, 8, 9, and 10, in the display device DD according to one or more embodiments of the present disclosure, each of the signal transmission lines TL may be bent at least once. Due to this, the display device DD may include separation spaces SS1, SS2, SS3, and SS4 each formed between two adjacent signal transmission lines TL and adjacent to each other in the oblique direction, and at least one identification block IB1, IB2, IB3, and IB4 may be located in each of the separation spaces SS1, SS2, SS3, and SS4. However, the present disclosure is not limited thereto. For example, each of the signal transmission lines TL may be bent in various ways so that the separation spaces SS1, SS2, SS3, and SS4 may be formed adjacent to each other in the oblique direction.

The present disclosure can be applied to various display devices. For example, the present disclosure is applicable to various display devices, such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, with functional equivalents thereof to be included therein.

What is claimed is:

1. A display device comprising:
   a substrate comprising a display area and a peripheral area;
   a light-emitting element in the display area;
   signal transmission lines on the substrate, extending in a first direction, and repeatedly located along a second direction crossing the first direction;
   separation spaces respectively between adjacent ones of the signal transmission lines, and adjacent to each other in an oblique direction; and
   an identification pattern comprising at least one identification block in the separation spaces.

2. The display device of claim 1, wherein a width of the separation spaces is greater than a width of a shortest distance between two adjacent signal transmission lines of the signal transmission lines.

3. The display device of claim 1, wherein the signal transmission lines comprise:
   a first line comprising a (1-1)th bent portion positioned in a first row;
   another first line comprising a (1-2)th bent portion positioned in a third row;
   a second line comprising a (2-1)th bent portion positioned in the first row and a (2-2)th bent portion positioned in a second row between the first row and the second row; and
   a third line comprising a (3-1)th bent portion positioned in the second row and a (3-2)th bent portion positioned in the third row.

4. The display device of claim 3, wherein the separation spaces comprise:
   a first separation space between the (1-1)th bent portion and the (2-1)th bent portion;
   a second separation space between the (2-2)th bent portion and the (3-1)th bent portion; and
   a third separation space between the (1-2)th bent portion and the (3-2)th bent portion.

5. The display device of claim 3, wherein the (1-1)th bent portion is bent in an opposite direction to the (1-2)th bent portion, the (2-1)th bent portion is bent in an opposite direction to the (2-2)th bent portion, and the (3-1)th bent portion is bent in an opposite direction to the (3-2)th bent portion.

6. The display device of claim 1, wherein the signal transmission lines comprise:
   a first line comprising a first bent portion positioned in a first row;
   a second line comprising a second bent portion positioned in a second row adjacent to the first row;
   a third line comprising a third bent portion positioned in a third row adjacent to the second row; and
   a fourth line comprising a fourth bent portion positioned in a fourth row adjacent to the third row.

7. The display device of claim 6, wherein the separation spaces comprise:
   a first separation space between the first bent portion and the second line adjacent to the first bent portion;
   a second separation space between the second bent portion and the third line adjacent to the second bent portion;
   a third separation space between the third bent portion and the fourth line; and
   a fourth separation space between the fourth bent portion and another first line of the signal transmission lines that is adjacent to the fourth bent portion.

8. The display device of claim 6, wherein the first, second, third, and fourth bent portions are bent in a same direction.

9. The display device of claim 1, wherein the signal transmission lines comprise:
   a first line comprising a first bent portion positioned in a first row;
   a second line comprising a second bent portion positioned in a second row adjacent to the first row;
   a third line comprising a third bent portion positioned in the first row; and
   a fourth line comprising a fourth bent portion positioned in the second row.

10. The display device of claim 9, wherein the separation spaces comprise:
   a first separation space between the first bent portion and the second line;
   a second separation space between the second bent portion and the third line;
   a third separation space between the third bent portion and the fourth line; and
   a fourth separation space between the fourth bent portion and another first line of the signal transmission lines.

11. The display device of claim 9, wherein the first, second, third, and fourth bent portions are bent in a same direction.

12. The display device of claim 1, wherein the signal transmission lines comprise:
  a first line comprising a (1-1)th bent portion positioned in a first row, and a (1-2)th bent portion positioned in a fourth row;
  a second line comprising a (2-1)th bent portion positioned in the first row, and a (2-2)th bent portion positioned in a second row adjacent to the first row;
  a third line comprising a (3-1)th bent portion positioned in the second row, and a (3-2)th bent portion positioned in a third row adjacent to the second row; and
  a fourth line comprising a (4-1)th bent portion positioned in the third row, and a (4-2)th bent portion positioned in the fourth row.

13. The display device of claim 12, wherein the separation spaces comprise:
  a first separation space between the (2-1)th bent portion and the third line;
  a second separation space between the (3-1)th bent portion and the fourth line;
  a third separation space between the (4-1)th bent portion and another first line of the signal transmission lines that is adjacent to the (4-1)th bent portion; and
  a fourth separation space between the (1-2)th bent portion and another second line of the signal transmission lines that is adjacent to the (1-2)th bent portion.

14. The display device of claim 12, wherein the (1-1)th bent portion and the (2-1)th bent portion are bent in a same direction, the (2-2)th bent portion and the (3-1)th bent portion are bent in a same direction, the (3-2)th bent portion and the (4-1)th bent portion are bent in a same direction, and the (1-2)th bent portion and the (4-2)th bent portion are bent in a same direction.

15. The display device of claim 1, wherein the signal transmission lines comprise:
  a first line comprising a (1-1)th bent portion positioned in a first row;
  another first line comprising a (1-2)th bent portion positioned in a second row adjacent to the first row, a (1-3)th bent portion positioned in a third row adjacent to the second row, and a (1-4)th bent portion positioned in a fourth row adjacent to the third row;
  a second line comprising a (2-1)th bent portion positioned in the first row, and a (2-2)th bent portion positioned in the second row;
  another second line comprising a (2-3)th bent portion positioned in the third row;
  a third line comprising a (3-1)th bent portion positioned in the first row, a (3-2)th bent portion positioned in the second row, and a (3-3)th bent portion positioned in the third row; and
  a fourth line comprising a (4-1)th bent portion positioned in the second row, a (4-2)th bent portion positioned in the third row, and a (4-3)th bent portion in the fourth row.

16. The display device of claim 15, wherein the separation spaces comprise:
  a first separation space between the (1-1)th bent portion and the (2-1)th bent portion, which are bent in opposite respective directions;
  a second separation space between the (2-2)th bent portion and the (3-2)th bent portion, which are bent in opposite respective directions;
  a third separation space between the (3-3)th bent portion and the (4-2)th bent portion, which are bent in opposite respective directions; and
  a fourth separation space between the (4-3)th bent portion and the (1-4)th bent portion, which are bent in opposite respective directions.

17. The display device of claim 1, further comprising a transistor comprising an active layer, a gate electrode, a source electrode, and a drain electrode in the display area,
  wherein the identification pattern is at a same layer as any one of the active layer, the gate electrode, the source electrode, and the drain electrode.

18. The display device of claim 1, wherein the at least one identification block comprises an identification number or an identification symbol.

19. The display device of claim 1, wherein respective sizes of the separation spaces are the same.

20. The display device of claim 1, wherein the signal transmission lines are connected to a data line for providing a data voltage to a pixel structure in the display area.

* * * * *